(12) United States Patent
Kennedy et al.

(10) Patent No.: US 7,177,205 B2
(45) Date of Patent: Feb. 13, 2007

(54) DISTRIBUTED LOOP COMPONENTS

(75) Inventors: Joseph T. Kennedy, Beaverton, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 259 days.

(21) Appl. No.: 10/833,966

(22) Filed: Apr. 27, 2004

(65) Prior Publication Data

US 2005/0237828 A1   Oct. 27, 2005

(51) Int. Cl.
G11C 11/4193   (2006.01)

(52) U.S. Cl. .................... 365/194; 365/233; 331/612

(58) Field of Classification Search .............. 365/194; 331/12
See application file for complete search history.

(56) References Cited

U.S. PATENT DOCUMENTS

| | | | | |
|---|---|---|---|---|
| 5,422,835 A | * | 6/1995 | Houle et al. ............... 708/103 |
| 5,459,402 A | * | 10/1995 | Ueno et al. ................ 324/617 |
| 6,081,462 A | * | 6/2000 | Lee .......................... 365/194 |
| 6,087,868 A | * | 7/2000 | Millar ....................... 327/156 |
| 6,173,345 B1 | * | 1/2001 | Stevens ..................... 710/100 |
| 6,229,363 B1 | * | 5/2001 | Eto et al. ................... 327/158 |
| 6,298,004 B1 | * | 10/2001 | Kawasaki et al. ........ 365/233 |
| 6,417,715 B2 | * | 7/2002 | Hamamoto et al. ....... 327/291 |
| 6,518,807 B1 | * | 2/2003 | Cho .......................... 327/158 |
| 6,633,185 B2 | * | 10/2003 | Starr ......................... 327/157 |
| 6,845,459 B2 | * | 1/2005 | Lin ........................... 713/401 |
| 6,954,094 B2 | * | 10/2005 | Lee et al. .................. 327/158 |
| 2003/0071669 A1 | | 4/2003 | Liu et al. |
| 2004/0056695 A1 | | 3/2004 | Starr |

OTHER PUBLICATIONS

J. Maneatis: "Low-jitter process-independent DLL and PLL based on self-baised techniques," IEEE Journal of Solid-State Circuits, vol. 31, No. 11, Nov. 1996, pp. 1723-1732.
PCT International Search Report, PCT/US2005/012075 (P18725PCT).
PCT Written Opinion of International Searching Authority PCT/US2005/012075 (P18725PCT).

* cited by examiner

*Primary Examiner*—Tan T. Nguyen
(74) *Attorney, Agent, or Firm*—Philip A. Pedigo (57) ABSTRACT

In some embodiments, a chip includes a chip interface to accept a delay control signal from outside the chip. The chip also includes a controllable delay line to delay an input signal responsive to the delay control signal to provide an output signal with a particular phase relationship to the input signal. Other embodiments are described and claimed.

27 Claims, 11 Drawing Sheets

DISTRIBUTED LOOP COMPONENTS

BACKGROUND

1. Technical Field

The present inventions relate to integrated circuit chips and, more particularly, to chips in which the components of loops, such as delay locked loops, are distributed amongst more than one chip.

2. Background Art

Controllable delay lines are often controlled through a phase detector used to compare the phase of the output of the delay line against some reference, and some sort of delay controller to process the output of the phase detector and adjust the delay of the controllable delay line accordingly.

Traditional controllable delay lines are controlled via some internal, on die mechanism, digital or analog, using control and signal processing blocks that may consume relatively large amounts of area or power. This can be especially problematic in devices where area and power are under severe constraints, for example DRAM (dynamic random access memory) chips.

Figure 1:
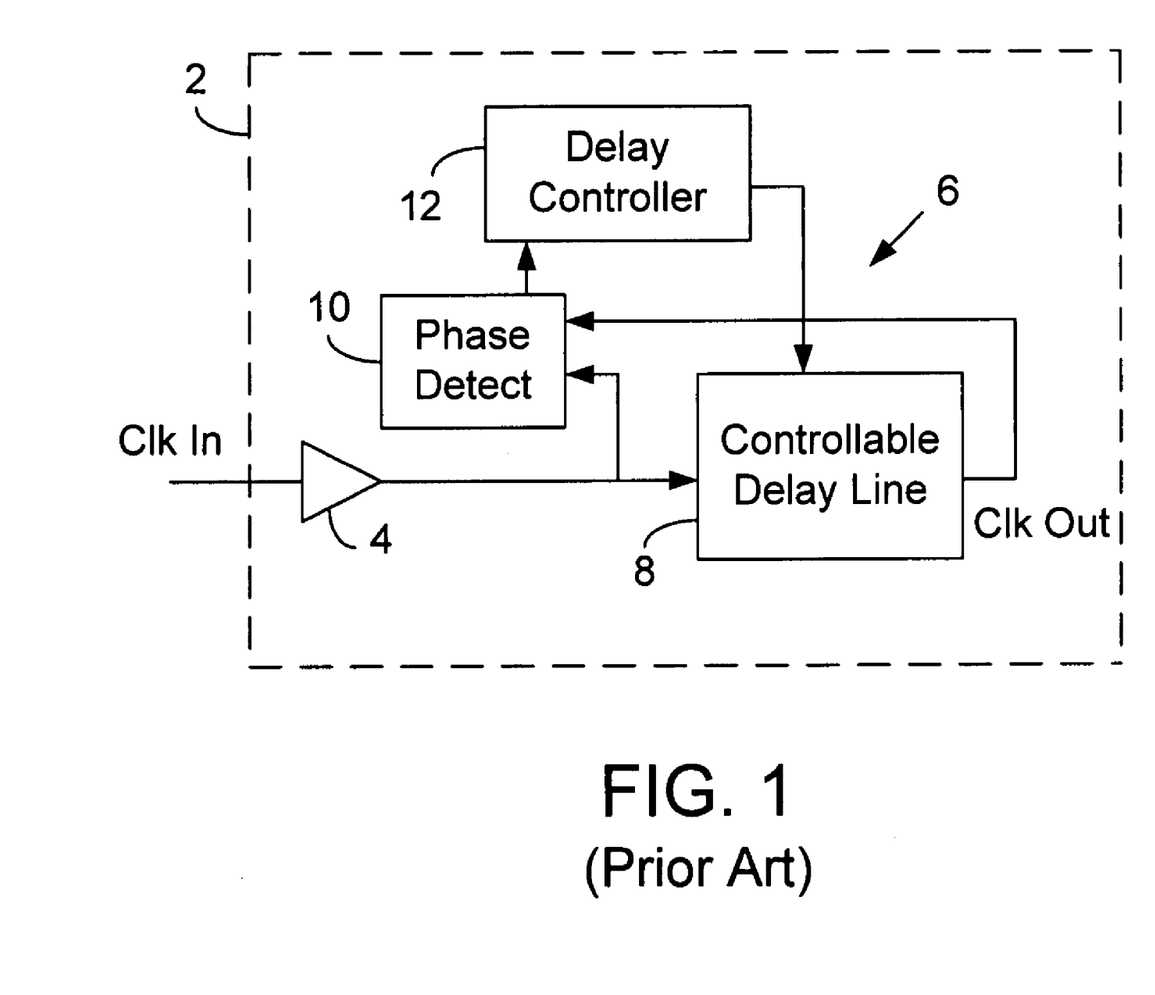
FIG. 1 is a schematic block diagram representation of a prior art chip in which a delay locked loop is contained in a single chip.

FIG. 1 illustrates a prior art chip 2 that includes delay locked loop (DLL) 6. DLL 6 includes a controllable delay line 8, a phase detector 10, and a delay controller 12. Controllable delay line 8 provides a controllable delay to an input signal (such as a clock input signal) from receiver 4 to provide an output signal (such as a clock output signal) that has a particular phase relationship to the input signal. Phase detector 10 receives the input and output signals and provides to delay controller 12 a phase difference indicating signal (sometimes called an error signal) that is indicative of a phase delay between the input and output signals. In response to the phase difference indicating signal, delay controller 12 provides a delay control signal to controllable delay line 8 to control delay of the input signal.

In some prior art systems, a capacitor of an analog loop filter has have been put as a discrete component off the chip onto a circuit board. For example, if delay controller 12 includes an analog loop filter, a capacitor of the loop filter might be put as a discrete component off the chip onto a circuit board that supports chip 2.

The desired phase difference between the clock input signal and the clock output signal may be zero degrees or some other amount such as 90 or 180 degrees. There may be various taps off of delay line 8 that provide signals have different phase relationships with the input signal.

There are numerous ways to implement DLLs. For example, in some DLLs, phase detector 10 merely detects whether the phase of the output signal is ahead of or behind the phase of the input signal and provides a binary signal to delay controller 12 in response thereto. Note that being more than half a cycle ahead is the same as being behind and being more than half a cycle behind is the same as being ahead. In other DLLs, phase detector 10 detects an amount of phase difference between the output signal and provides a signal that is related (for example, proportional) to the phase difference to delay controller 12. Various other details exist. The controllable delay lines and delay controller may be digital or analog. Charge pumps, low pass filters, digital signal processors (DSPs), DSP filters, and finite state machines (FSMs) may be used.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

DETAILED DESCRIPTION

Figure 2:
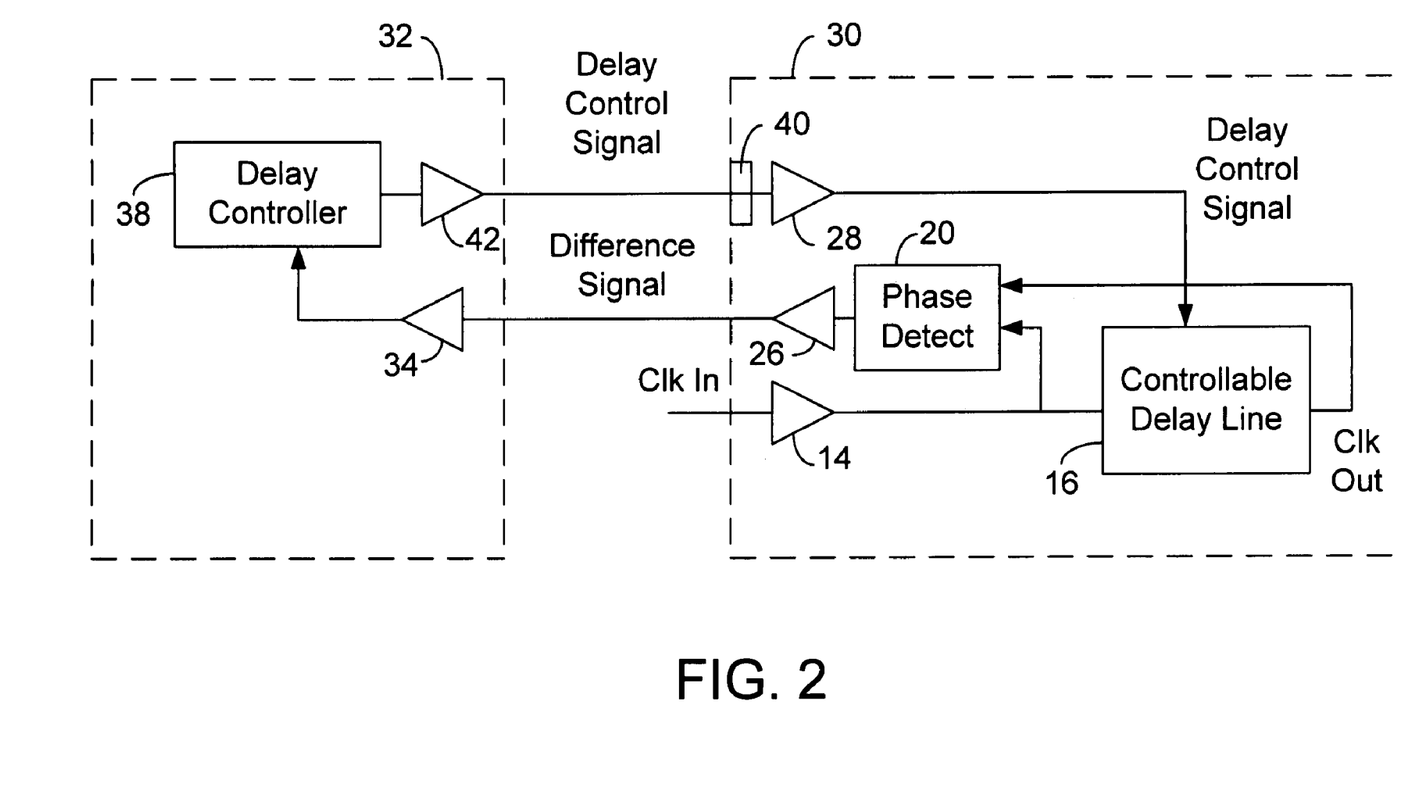
FIGS. 2–10 are each schematic block diagram representations of a system in which a delay locked loop is distributed amongst more than one chip according to some embodiments of the inventions.

FIG. 2 includes a DLL which is similar to that of prior art FIG. 1, except that the delay controller is in another chip. Referring to FIG. 2, a chip 30 includes controllable delay line 16 that delays a received clock input signal from a receiver 14 to provide a clock output signal. The phases of the clock input signal and clock output signal are compared by phase detector 20. The phase difference indicating signal (sometimes called an error signal) from phase detector 20 is passed through a driver 26 and receiver 34 to delay controller 38 in a chip 32. The delay control signal from delay controller 38 is passed through driver 42, chip interface 40, and receiver 28 to controllable delay line 16. The details of chip interface 40 various depending on the particular technology used. In some embodiments, chip interface 40 includes a bond pad.

Receiver 14, controllable receiver 14, delay line 16, phase detector 20, and delay controller 38 may be the same as or different than prior art receiver 4, controllable delay line 8, phase detector 10, and delay controller 12, respectively. The inventions are intended to cover a wide variety of implementations of these components.

The nature of phase difference indicating signal from phase detector 20 is different in different embodiments. In some embodiments, it merely indicates whether the phase of the output signal is ahead of or behind the phase of the input signal. In other embodiments, the phase indicating signal indicates an amount of the difference. In still other embodiments, it may include additional information. If they have more than one bit, the phase difference indicating signal and other signals such as the delay control signal may be serial or parallel signals. Accordingly, the interconnects between driver 26 and receiver 34 and between driver 42 and receiver 28 each may be one or more conductors. As shown in other embodiments, there may be single conductor which is sequentially or simultaneously bidirectional. Drivers 26 and 42 and receivers 14, 28, and 34 are optional.

In FIG. 2, it is not specified whether controllable delay line 16 is a digital or an analog delay line. Further, details of delay controller 38 are not specified. FIGS. 2–6 provide embodiments with additional details.

In FIGS. 2–11, the desired phase difference between the clock input signal and the clock output signal may be zero degrees or some other amount such as 90 or 180 degrees. There may be various taps off of the delay line that provide signals with different phase relationships to the input signal.

Figure 3:
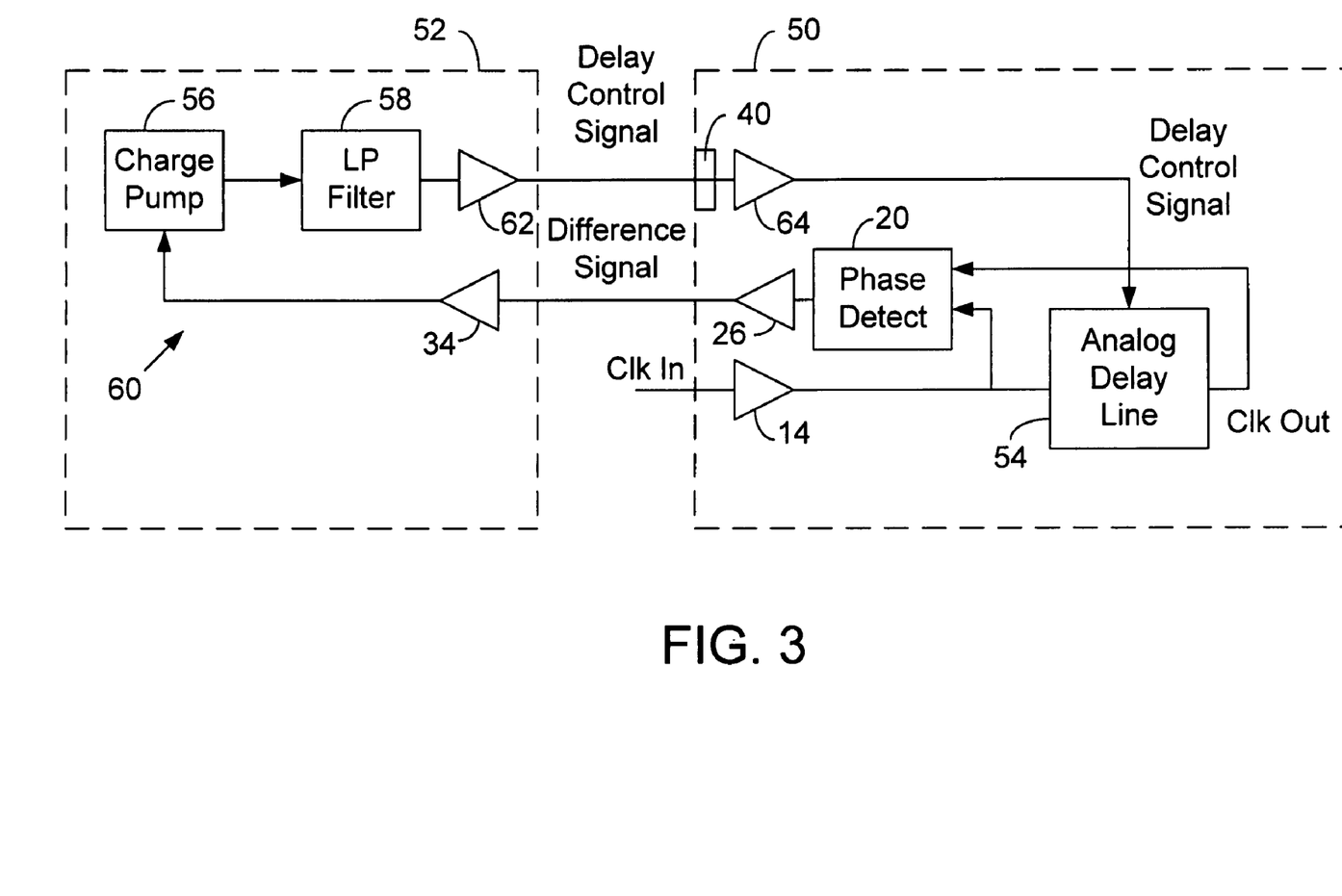

In FIG. 3, a chip 50 includes controllable analog delay line 54 that delays a received clock input signal from receiver 14 to provide a clock output signal. The phases of the clock input signal and clock output signal are compared by phase detector 20. The phase difference indicating signal from phase detector 20 is passed through a driver 26 and receiver 34 to a charge pump 56 of a delay controller 60 in a chip 52. Delay controller 60 also includes a low pass (LP) filter 58. Charge pump 56 provides a charge pump signal to a filter 58. The voltage of charge pump signal is related to the phase difference detected by phase detector 20. The filtered charge pump signal is a delay control signal that is passed by driver 62 to chip interface 40, receiver 64, and analog delay line 54.

Figure 4:
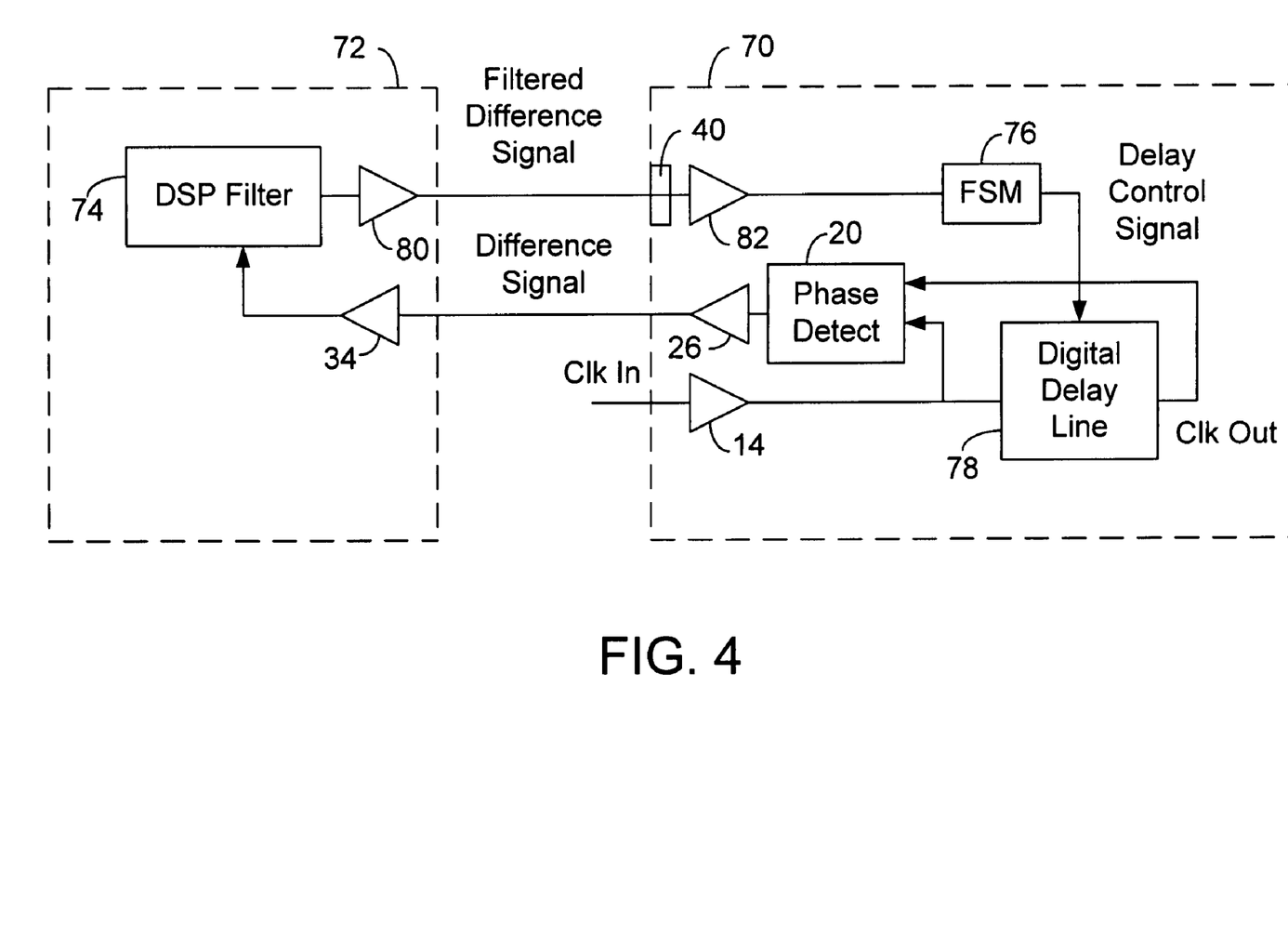

In FIG. 4, a chip 70 includes controllable digital delay line 78 that delays a received clock input signal from receiver 14 to provide a clock output signal. The phases of the clock input signal and clock output signal are compared by phase detector 20. The phase difference indicating signal from phase detector 20 is passed through a driver 26 and receiver 34 to a digital signal processor (DSP) filter 74. DSP filter 74 provides a signal to driver 80 which is related to the phase difference detected by phase detector 20. The signal from DSP filter 74 is provide from driver 80 to receiver 82 and finite state machine (FSM) 76. DSP filter 74 and FSM 76 may be thought of as two parts of a delay controller. FSM 76 provides a delay control signal to digital delay line 78. FSM 76 determines the amount of the delay based on the signal from DSP filter 74. Drivers 26 and 80 and receivers 34 and 82 are optional.

Figure 5:
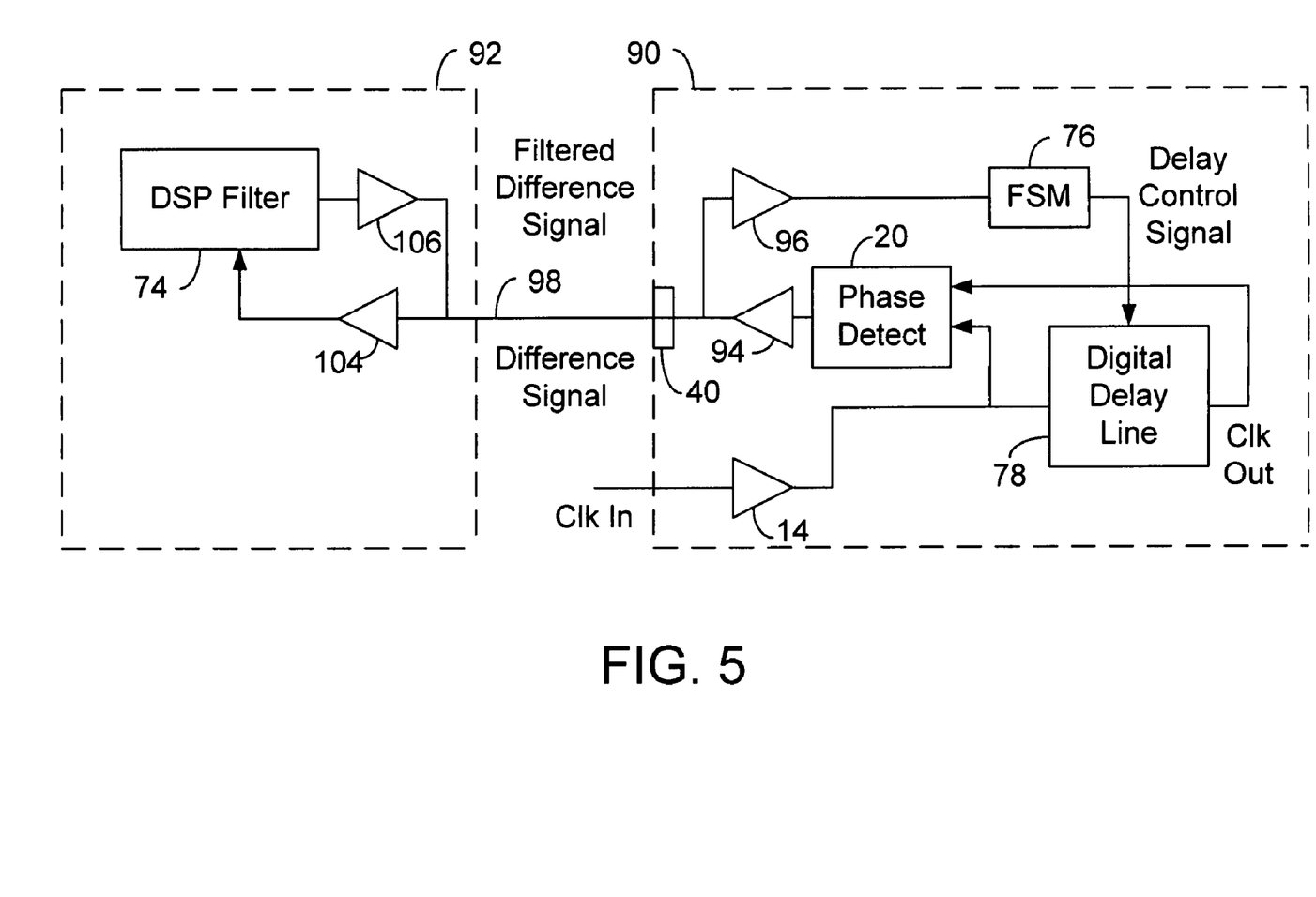

FIG. 5 is similar to FIG. 4 except that in FIG. 5 the interconnects shown between chips 90 and 92 are bidirectional (between drivers 94 and 106 and receivers 96 and 104) and in FIG. 4, the two interconnects shown between chips 70 and 72 are unidirectional (one interconnect between driver 26 and receiver 34, and another interconnect between driver 80 and receiver 82). The systems shown with a bidirectional interconnect may be modified to replace it with unidirectional signaling. The systems shown with unidirectional interconnects may be modified to replace them with a bidirectional interconnect. The bidirectional signaling may be sequential or simultaneous signaling. The bidirectional and unidirectional signaling may be according to a prior technique or a technique that is not prior art.

The following is a prior art way in which simultaneous bidirectional signaling may be accomplished. Referring to FIG. 5, a simultaneous bidirectional signal can be created by driver 94 driving a particular signal and receiver 96 monitoring the voltage on interconnect 98. Receiver 96 may subtract the voltage of the outgoing signal from the voltage on interconnect 98 to receive the incoming signal. Receiver 96 may perform outbound subtraction by use of a pair of selectable reference voltages. The state of the output signal is used to select the appropriate reference voltages, effecting a subtraction of the outbound signal from the signal present on conductor 98. The timing of the reference voltage change should be such as to match the output from transmitter 94. Table 1 below shows an example for simultaneous bidirectional signaling, where Vcc is the supply voltage for transmitters and receivers of chips 90 and 92 and where a logical high voltage is near Vcc and a logical low voltage is near Vss (ground). This could be at full voltage swing or at a low voltage swing.

TABLE 1

(example of simultaneous bidirectional signaling)

| Voltage driven by transmitter 94 | Reference voltage of receiver 96 | Voltage driven by transmitter in chip 106 | Output of receiver 96 |
|---|---|---|---|
| Logical high | ¾ Vcc | Logical high | Logical high |
| Logical high | ¾ Vcc | Logical low | Logical low |
| Logical low | ¼ Vcc | Logical high | Logical high |
| Logical low | ¼ Vcc | Logical low | Logical low |

Figure 6:
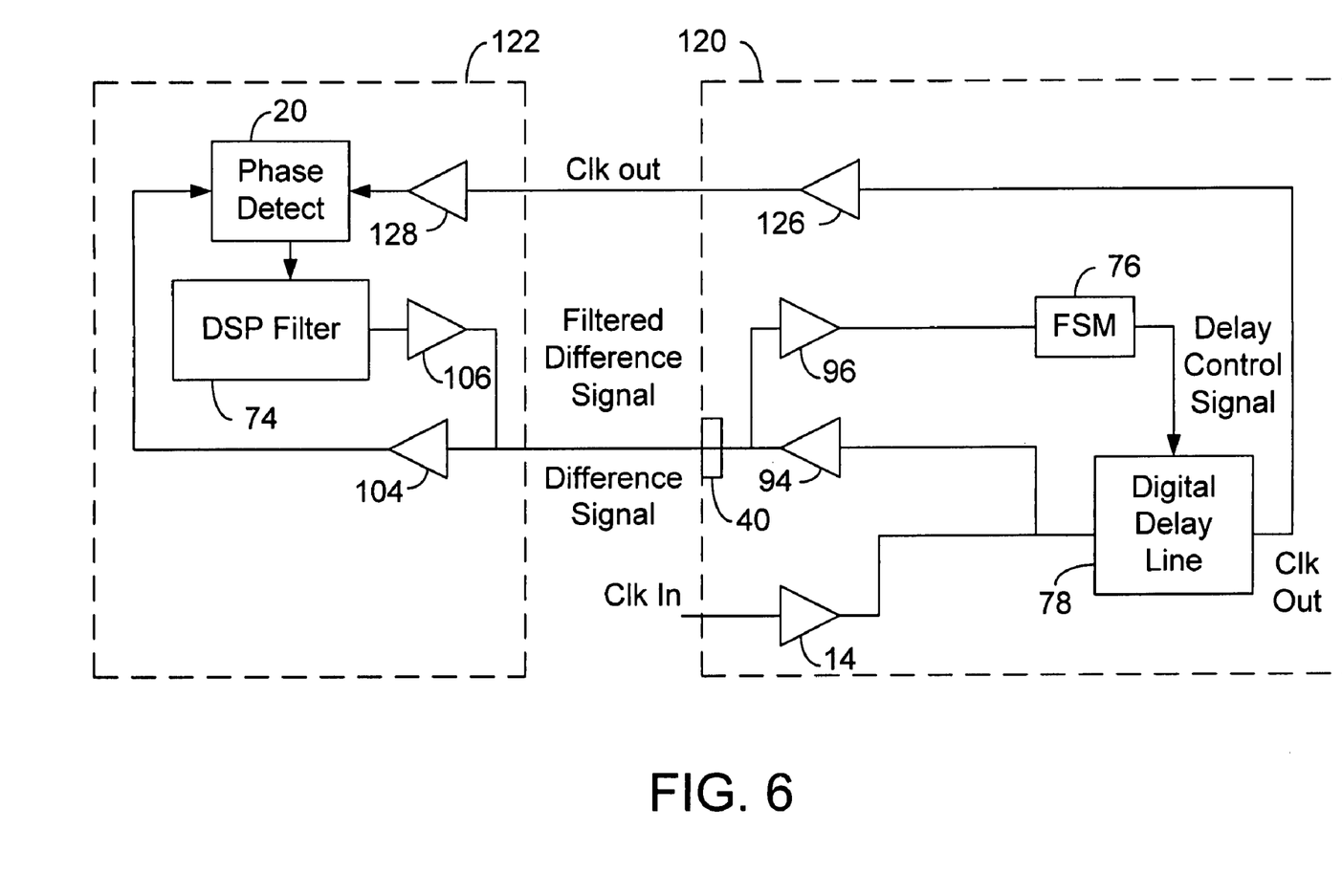

The system of FIG. 6 is similar to that of FIG. 5 except that in FIG. 4, controllable digital delay line 78 and phase detector 20 are in the same chip (chip 90), whereas in FIG. 6, controllable digital delay line 78 and phase detector 20 are in different chips (chips 120 and 122). FIG. 6 includes optional driver 126 and receiver 128 to allow the clock output signal to be passed to phase detector 20. In FIG. 6, the signal passed through driver 94 and receiver 104 is the clock input signal which is provided to phase detect 20. (Other systems, such those of FIGS. 2 and 3 could be modified to have the phase detector in a different chip than the delay line.)

Figure 7:
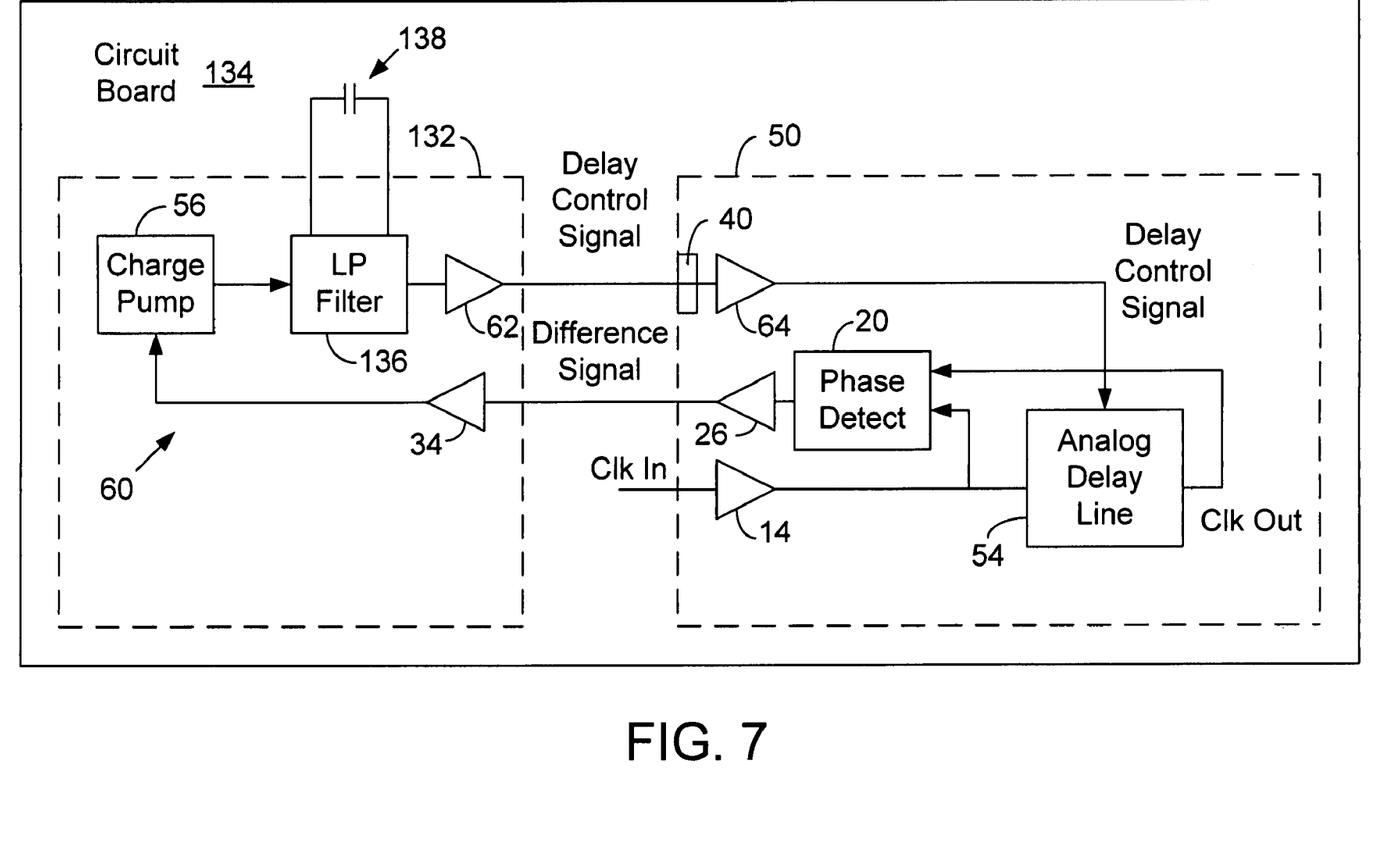

FIG. 7 is similar to FIG. 3 except that in FIG. 3 all of LP filter 58 is in chip 52, where as FIG. 7, a portion of LP filter 136 is outside of chip 132. More particularly, in FIG. 7, chip 50 and a chip 132 are supported by a circuit board 134. LP filter 136 includes a capacitor 138 that is outside chip 132 and is supported by circuit board 134. Capacitor 138 may be a discrete component, in a package of other capacitors, or in some other arrangement. Alternatively, chips 134 and capacitor 138 could be supported by a different circuit board than is chip 50.

Chips 30, 32, 50, 52, 70, 72, 90, 92, 120, 122, and 132 may be any of various types of chips both as to their purpose. As an example, chips 20, 50, 70, 90, and 120 may be memory chips such as DRAM (dynamic random access memory) chips and chips 32, 52, 72, 92, 122, and 132 may be memory controllers, a buffer, another memory chip or some other type of chip.

Figure 8:
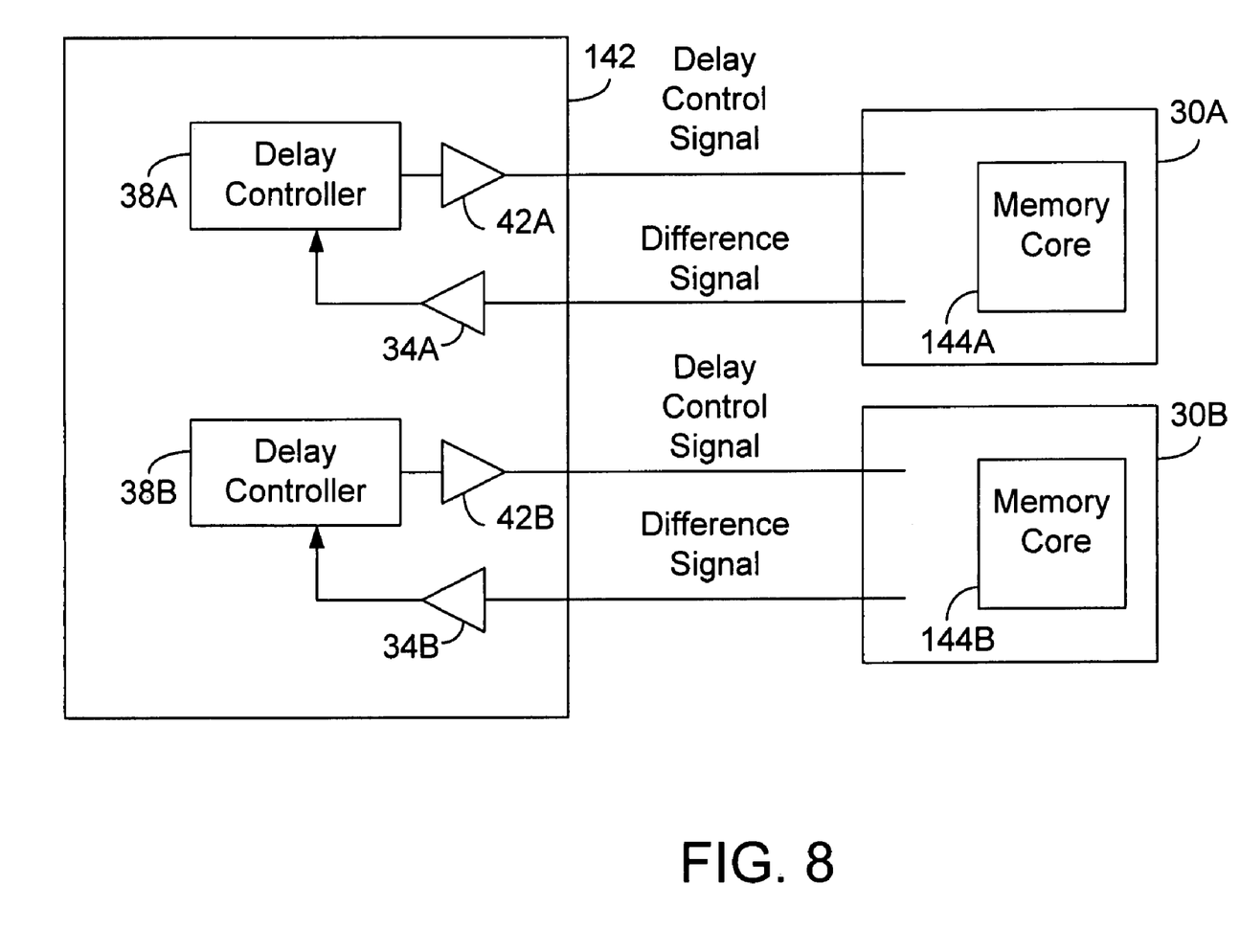

FIG. 8 illustrates a system in which chips 30A and 30B are coupled to chip 142. Chips 30A and 30B each have a controllable delay line, phase detector, receivers, and a driver like in chip 30 although they are not illustrated in FIG. 8. Further, FIG. 8 illustrates that chips 30A and 30B have memory cores 144A and 144B, respectively, and are examples of memory chips, such as DRAM chips. Memory controller chip 142 is like chip 32 of FIG. 2 except that there are two delay controllers (38A and 38B) like delay controller 38 of FIG. 2 and corresponding drivers 42A and 42B and receivers 34A and 34B.

Figure 9:
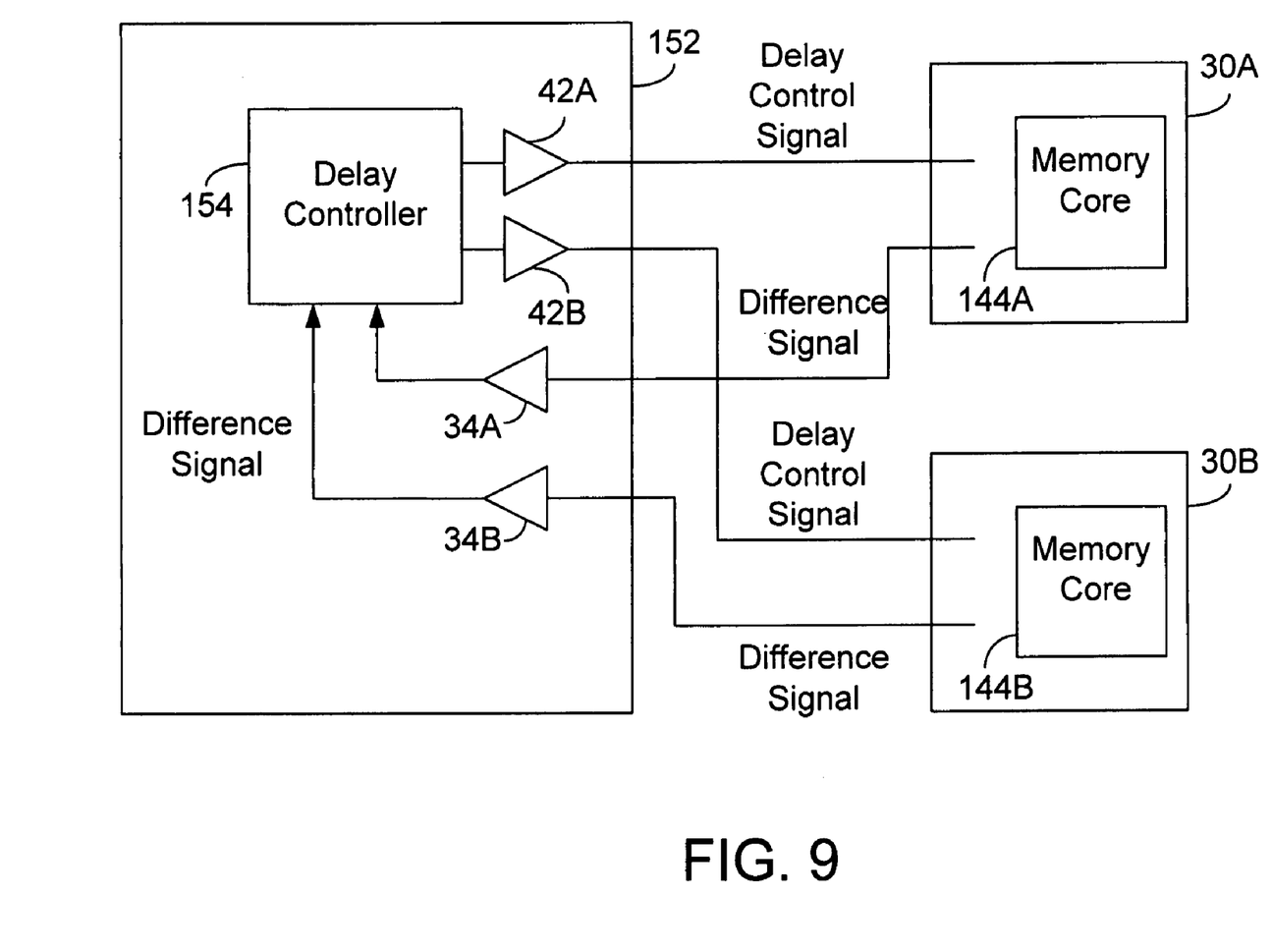

FIG. 9 illustrates a system in which chips 30A and 30B are coupled to chip 152. Chips 30A and 30B each have a controllable delay line, phase detector, receivers, and a driver like in chip 30 although they are not illustrated in FIG. 8. Further, FIG. 8 illustrates that chips 30A and 30B have memory cores 144A and 144B, respectively, and are examples of memory chips, such as DRAM chips. Memory controller chip 152 is like chip 32 of FIG. 2 except that delay controller 154 receives signals from phase detectors in both chips 30A and 30B. Note that FIGS. 8 and 9 shows examples of unidirectional signaling, but they could use bidirectional signaling.

In FIG. 8, delay controller 38A determines the delay control signal to provide to chip 30A independently delay controller 38B determining the delay control signal to provide to chip 30B. By contrast, in FIG. 9, the delay control signal provided by delay controller 154 is the same to both drivers 42A and 42B and is responsive to, for example, an average of the signals from receivers 34A and 34B. In FIG. 8, delay controllers 38A and 38B could share some circuitry, but still operate independently.

Figure 10:
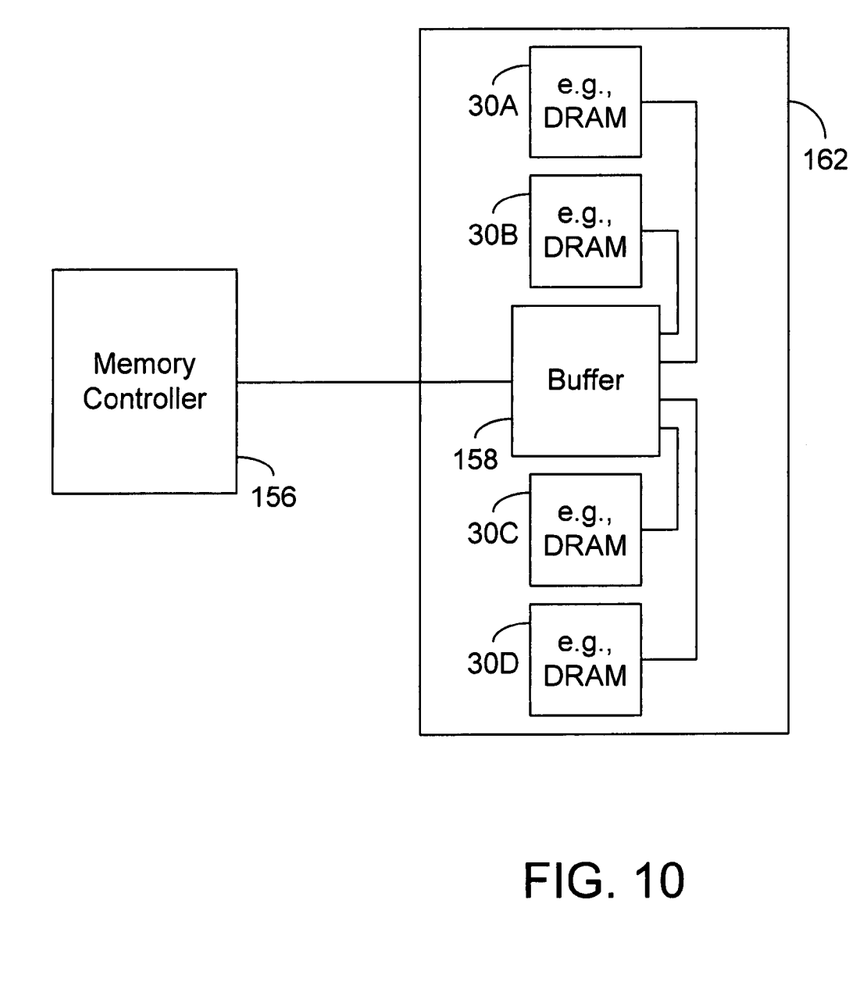

FIG. 10 illustrates a memory system with a memory controller 156 coupled to a buffer 158 on a memory module 162. Memory module 162 also includes memory chips 30A, 30B, 30C, and 30D (for example, DRAM chips) coupled to buffer 158. In practice, there may be more memory chips on the memory module. Circuitry such as is illustrated in chips 32, 52, 72, 92, 122, 132, 142, and 152 may be included in buffer 148, while circuitry such as in chips 30, 50, 70, 90 or 120 may be in the memory chips 30A, 30B, 30C, and 30D. The chips of FIGS. 3–7 could also be used in arrangements like those of FIGS. 8–10.

Figure 11:
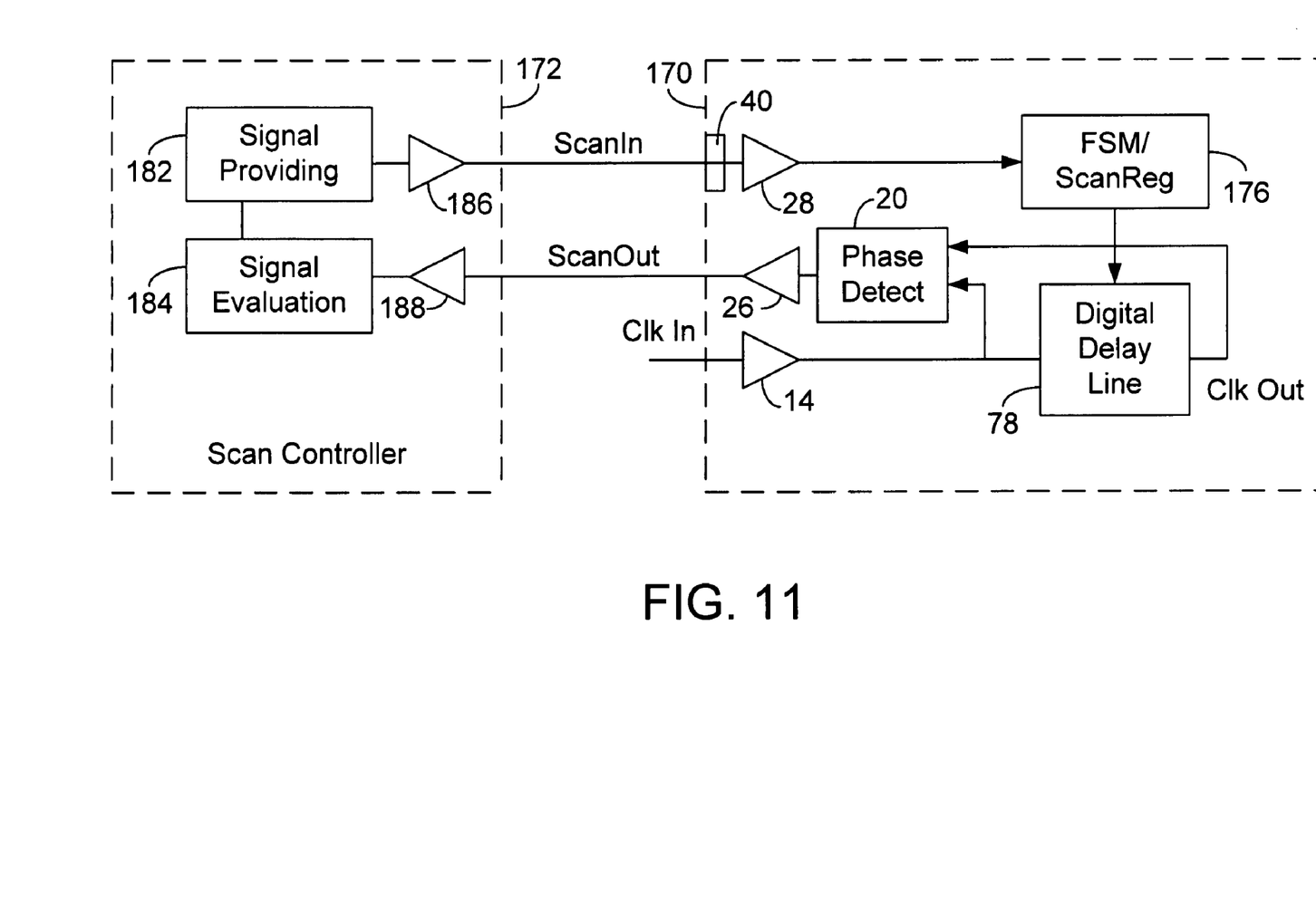
FIG. 11 is a schematic block diagram representation of a test system in which a delay locked loop is distributed amongst more than one chip according to some embodiments of the inventions.

FIG. 11 illustrates a scan controller 172 that tests chip 170. Signal providing circuitry 182 provides scan input signals (ScanIn) through driver 186 and receiver 28 to FSM/scan register (ScanReg) 176. In response to the scan input signals, FSM/scan register 176 provides a delay control signal to controllable digital delay line 78. Phase detector 20 compares the clock input signal from receiver 14 and the clock out signal from digital delay line 78 and provides a phase difference signal (referred to as ScanOut) to evaluation circuitry 184 through driver 26 and receiver 188. Through providing difference scan input signals and evaluating the resulting phase difference signals, scan controller chip 172 can test aspects of the delay line 78 of chip 170. The chips of FIGS. 2–10 may be modified to include scan capability similar to that of FIG. 11.

The delay control signal may be modified such as through bidirectional signaling or be inverted and still be considered the delay control signal.

The components of FIGS. 2–11 are not new, but to the inventors knowledge, distributing them amongst multiple chips as shown in FIGS. 2–11 is new.

The chips in FIGS. 1–11 include circuitry and interconnects in addition to those illustrated in the figures. There may be additional control circuitry not shown to control when the signals are passed between chips. In FIGS. 2–11, the interconnects may also pass other signals not described herein. There may be additional circuitry such as electrostatic discharge circuitry on the lines. There may be various additional interconnects between the chips of the figures. The signaling between chips may be electrical, optical or electromagnetic. The input and output signals do not have to be clock signals. The drivers and receives and other circuitry may be of various types including voltage mode or current mode. The delay controller may controller an additional delay line that is not in the loop.

The chips of figures may be in computer system including desktop computer system, a server computer system, a mobile computer system, and an embedded computer system. The chips may also be in communication systems that are in or that are not in a computer system.

The signals are not restricted to any particular type of signaling. The signals may be, for example, be packetized or time multiplexed. The interconnects and signals may be differential or single ended. The signals may be coded such as in 8b/10b coding. Various types of drivers and receivers may be used. The drivers and receivers may or may not invert the signals they receive.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The inventions are not restricted to the particular details described herein. Indeed, many other variations of the foregoing description and drawings may be made within the scope of the present inventions. Accordingly, it is the following claims including any amendments thereto that define the scope of the inventions.

What is claimed is:

1. A chip comprising:
   a chip interface to accept a delay control signal from outside the chip; and
   a controllable delay line to delay an input signal responsive to the delay control signal to provide an output signal with a particular phase relationship to the input signal, wherein the delay control signal is an output of at least part of a delay controller, wherein the delay controller is to receive a signal indicative of a phase difference between the input and output signals to provide the delay control signal.

2. The chip of claim 1, further comprising a phase detector to receive the input and output signals and to provide a phase difference signal indicative of a phase difference between the input signal and the output signal.

3. The chip of claim 1, wherein the controllable delay line is an analog delay line.

4. The chip of claim 1, wherein the chip is memory chip.

5. The chip of claim 4, wherein the memory chip is a DRAM chip.

6. The chip of claim 1, further comprising a receiver between the chip interface and the controllable delay line to receive the delay control signal.

7. The chip of claim 6, wherein the receiver assists in simultaneous bidirectional signaling and the voltage of the delay control signal may change in the receiver.

8. A chip comprising:
   a chip interface to accept a signal from outside the chip;
   a state machine to provide a delay control signal responsive to the signal from outside the chip; and
   a controllable delay line to delay an input signal responsive to the delay control signal to provide an output signal with a particular phase relationship to the input signal.

9. The chip of claim 8, further comprising a phase detector to receive the input and out signals and to provide a phase difference signal indicative of a phase difference between the input signal and the output signal.

10. The chip of claim 8, wherein the signal from outside the chip is an filtered phase difference signal.

11. The chip of claim 8, wherein the input and output signals are clock signals.

12. The chip of claim 8, wherein the chip is memory chip.

13. The chip of claim 8, further comprising a receiver between the chip interface and the state machine to receive the signal from outside the chip.

14. The chip of claim 13, wherein the receiver assists in simultaneous bidirectional signaling and the voltage of the signal from outside the chip may change in the receiver.

15. The chip of claim 8, wherein the controllable delay line is a digital delay line.

16. A system comprising:
a first chip including:
a chip interface to accept a delay control signal from outside the chip; and
a controllable delay line to delay an input signal responsive to the delay control signal to provide an output signal with a particular phase relationship to the input signal; and
a second chip including:
at least a portion of a delay controller to receive a signal indicative of a phase difference between the input and output signals and in response thereto to provide the delay control signal.

17. The system of claim 16, wherein the first chip includes a phase detector to receive the input and output signals and to provide a phase difference signal indicative of a phase difference between the input signal and the output signal.

18. The system of claim 16, wherein the controllable delay line, phase detector, and delay controller are part of a delay locked loop.

19. The system of claim 16, wherein the second chip includes a phase detector to receive the input and output signals and to provide a phase difference signal indicative of a phase difference between the input signal and the output signal.

20. The system of claim 16, wherein the first chip is a memory chip and the second chip includes a memory controller.

21. The system of claim 16, further comprising a memory module substrate and wherein the first chip is a memory chip on the substrate and the second chip is a buffer on the substrate, and where there are other chips like the first chip that share the delay controller of the second chip.

22. The system of claim 16, wherein the delay controller includes a charge pump and a low pass filter.

23. The system of claim 16, wherein signaling between the delay control signal is passed from the second chip to the first chip in unidirectional signaling.

24. The system of claim 16, wherein signaling between the delay control signal is passed from the second chip to the first chip in sequential bidirectional signaling.

25. The system of claim 16, wherein signaling between the delay control signal is passed from the second chip to the first chip in simultaneous signaling.

26. A system comprising:
a first chip including:
a chip interface to receive a signal from outside the chip;
a state machine to provide a delay control signal responsive to the signal from outside the chip; and
a controllable delay line to delay an input signal responsive to the delay control signal to provide an output signal with a particular phase relationship to the input signal; and
a second chip including:
a portion of a delay controller to receive a signal indicative of a difference between the input and output signals and in response thereto to provide an initial delay control signal; and
wherein the delay control signal is provided from the second chip to the chip interface of the first chip.

27. The system of claim 26, wherein the first chip includes a phase detector to receive the input and output signals and to provide a phase difference signal indicative of a phase difference between the input signal and the output signal.

* * * * *